(12) United States Patent
Jeong et al.

(10) Patent No.: US 9,911,479 B2
(45) Date of Patent: Mar. 6, 2018

(54) SEMICONDUCTOR MEMORY DEVICE OUTPUTTING READ-BUSY SIGNAL AND MEMORY SYSTEM INCLUDING THE SAME

(71) Applicant: SK hynix Inc., Gyeonggi-do (KR)

(72) Inventors: Jae Hyeong Jeong, Seoul (KR); Kwang Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 14/967,621

(22) Filed: Dec. 14, 2015

(65) Prior Publication Data

US 2017/0018296 A1 Jan. 19, 2017

(30) Foreign Application Priority Data

Jul. 13, 2015 (KR) .................. 10-2015-0099188

(51) Int. Cl.
*G11C 7/10* (2006.01)
*G11C 8/06* (2006.01)
*G11C 7/22* (2006.01)

(52) U.S. Cl.
CPC ............... *G11C 8/06* (2013.01); *G11C 7/109* (2013.01); *G11C 7/1045* (2013.01); *G11C 7/1063* (2013.01); *G11C 7/22* (2013.01)

(58) Field of Classification Search
CPC .. G11C 8/06; G11C 7/20; G11C 16/20; G11C 7/109; G11C 7/22
See application file for complete search history.

(56) References Cited

U.S. PATENT DOCUMENTS 8,151,039 B2 4/2012 Lai et al.
2013/0176788 A1* 7/2013 Kim ...................... G11C 16/06
                                                    365/185.18
2015/0143155 A1* 5/2015 Cho ........................ G11C 5/066
                                                    713/401

FOREIGN PATENT DOCUMENTS

KR         100869984        11/2008
KR       1020130025655       3/2013

* cited by examiner

*Primary Examiner* — Mohammed A Bashar
(74) *Attorney, Agent, or Firm* — IP & T Group LLP

(57) ABSTRACT

A semiconductor memory device includes a plurality of memory cells; a peripheral circuit suitable for controlling the memory cells, and operating in first and second modes respectively corresponding to enablement and disablement of a chip selection signal; and a ready-busy signal generator suitable for biasing a ready-busy line according to whether the peripheral circuit is in a ready or busy state during the enablement of the chip selection signal. Communication between the semiconductor memory device and an external device is allowed in the first mode. The communication between the semiconductor memory device and the external device is not allowed in the second mode.

19 Claims, 12 Drawing Sheets

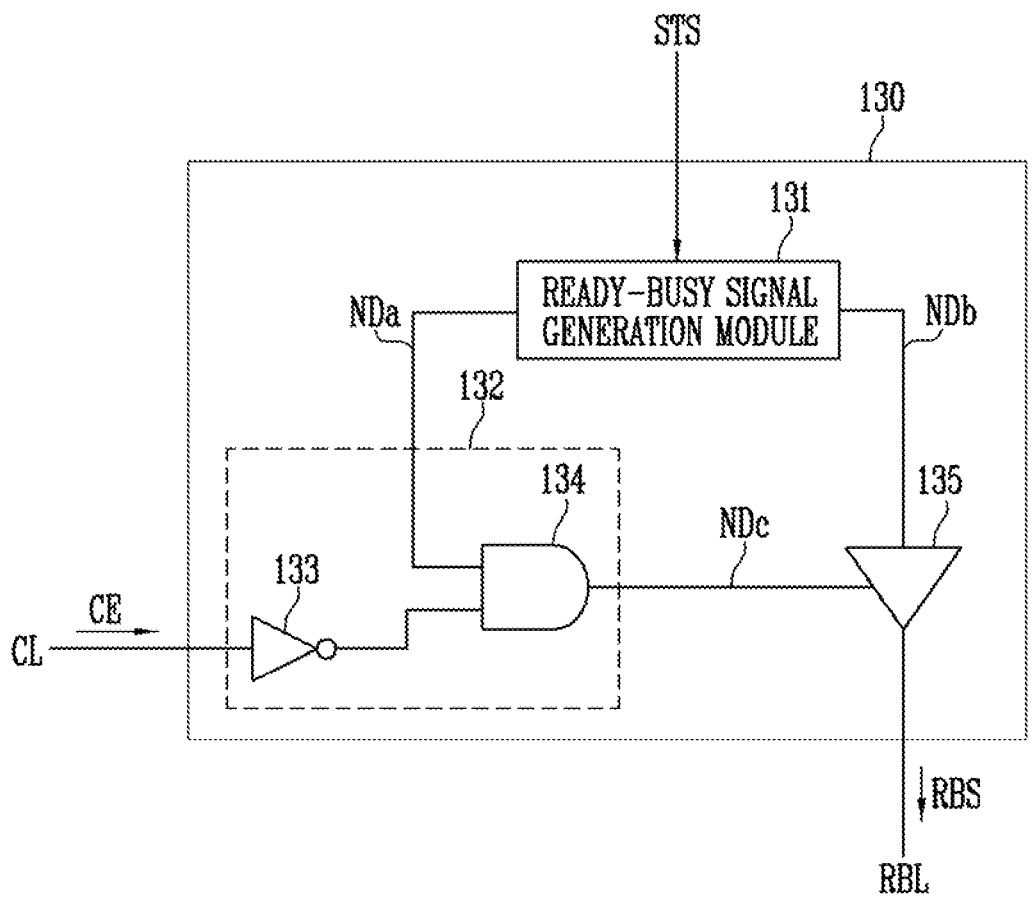

FIG. 13

| control bits by ALE and CLE | CE | STS | RBS |
|---|---|---|---|
| 00 | 0 | 1 (busy) | 0 |
| 00 | 0 | 0 (ready) | floating |
| 00 | 1 | 1 (busy) | floating |
| 00 | 1 | 0 (ready) | floating |

SEMICONDUCTOR MEMORY DEVICE OUTPUTTING READ-BUSY SIGNAL AND MEMORY SYSTEM INCLUDING THE SAME

CROSS-REFERENCE TO RELATED APPLICATION

The present application claims priority to Korean patent application number 10-2015-0099188 filed on Jul. 13, 2015, the entire disclosure of which is herein incorporated by reference.

BACKGROUND

Field

The present disclosure relates to an electronic device, and, in particular, a semiconductor memory device outputting a ready-busy signal and a memory system including the same.

Discussion of Related Art

A semiconductor memory device may be implemented using a semiconductor such as silicon (Si), Germanium (Ge), gallium arsenide (GaAs), indium phosphite (InP) or the like. The semiconductor memory device may be classified into volatile and nonvolatile memory devices.

In the volatile memory device, a power turn-off may lead to a cancellation of stored data therein. The volatile memory device may include the static RAM (SRAM), the dynamic RAM (DRAM), the synchronous DRAM (SDRAM), etc. In the nonvolatile memory device, despite a power turn-off, the stored data therein may be maintained. The nonvolatile memory device may include the read only memory (ROM), the programmable ROM (PROM), the electrically programmable ROM (EPROM), the electrically erasable and programmable ROM (EEPROM), the flash memory, the phase-change RAM (PRAM), the magnetic RAM (MRAM), the resistive RAM (RRAM), the ferroelectric RAM (FRAM) and the like. The flash memory may be classified into NOR and NAND architectures.

SUMMARY

The present disclosure memory may provide, in one aim thereof, a memory system with an enhanced operation rate.

In one aspect of the present disclosure, there is provided a semiconductor memory device including a plurality of memory cells; a peripheral circuit suitable for controlling the memory cells, and operating in first and second modes respectively corresponding to enablement and disablement of a chip selection signal; and a ready-busy signal generator suitable for biasing a ready-busy line according to whether the peripheral circuit is in a ready or busy state during the enablement of the chip selection signal, wherein communication between the semiconductor memory device and an external device is allowed in the first mode, and wherein the communication between the semiconductor memory device and the external device is not allowed in the second mode.

In one aspect of the present disclosure, there is provided a memory system including a plurality of semiconductor memory devices coupled to a single channel; and a controller coupled to the channel, and suitable for selecting one among the semiconductor memory devices in response to enabled one of chip selection signals and suitable for communicating with the selected semiconductor memory device over the channel, wherein the controller is further coupled to the plurality of the semiconductor memory devices over a ready-busy line, wherein the controller further determines whether the selected semiconductor memory device is in a ready or busy state by detecting a ready-busy signal provided from the selected semiconductor memory device through the ready-busy line during enablement of the enabled chip selection signal.

In one aspect of the present disclosure, there is provided a memory system including a plurality of semiconductor memory devices suitable for sharing a single ready-busy line, wherein each of the devices comprises: a peripheral circuit suitable for controlling memory cells of the device, and operating in first and second modes respectively corresponding to enablement and disablement of a chip selection signal; and a ready-busy signal generator suitable for biasing the single ready-busy line according to whether the peripheral circuit is in a ready or busy state during the enablement of the chip selection signal, wherein communication between the semiconductor memory device and an external device is allowed in the first mode, and wherein the communication between the semiconductor memory device and the external device is not allowed in the second mode.

In accordance with the present disclosure, the memory system could have an enhanced operation rate.

BRIEF DESCRIPTION OF THE DRAWINGS

A brief description of each drawing is provided to more fully understand the drawings, which is incorporated in the detailed description of the invention.

FIG. 5 is a block diagram of one embodiment of a ready-busy signal generator in FIG. 3.

FIG. 6 illustrates a table of outputs of a ready-busy signal generator based on a chip selection signal.

FIG. 13 is a table of outputs of a ready-busy signal generator based on a chip selection signal, address latch enable signal, and command latch enable signal.

DETAILED DESCRIPTION

Figure 1:
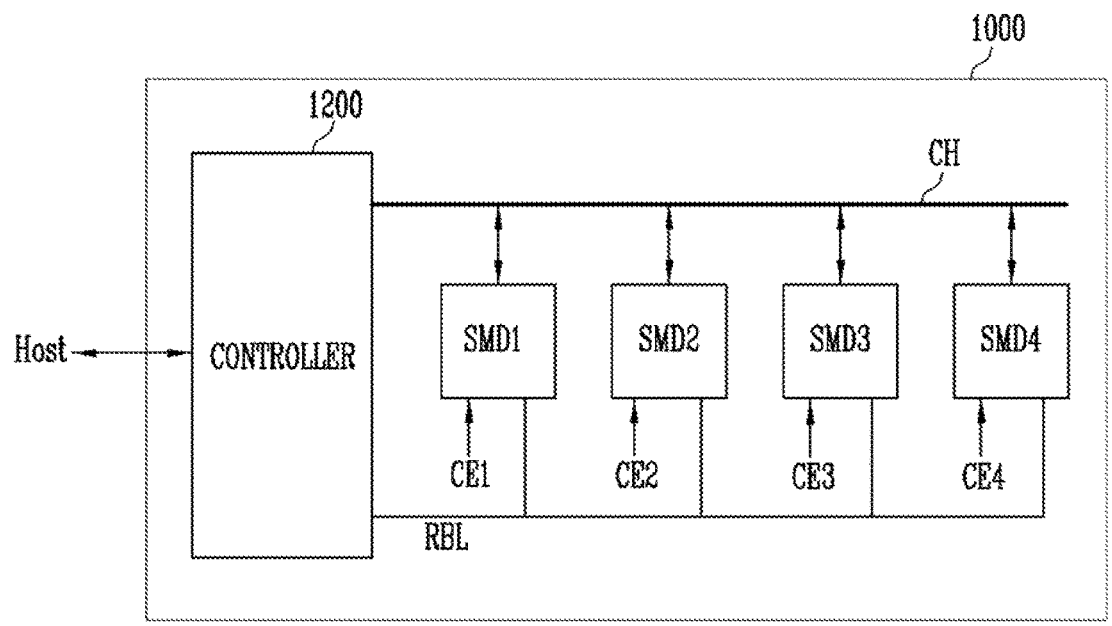
FIG. 1 is a block diagram of a memory system in accordance with one implementation of the present disclosure.

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "Including" when used in this specification, specify the presence of the stated features, integers, s, operations, elements, and/or components, but do not preclude the presence or addition of one or more other features, integers, s, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIG. 1 is a block diagram of a memory system 1000 in accordance with one implementation of the present disclosure.

Referring to FIG. 1, the memory system 1000 may include a plurality of the semiconductor memory devices SMD1 to SMD4 and the controller 1200.

First to fourth semiconductor memory devices SMD1 to SMD4 may communicate with the controller 1200 through a single common channel CH. Although in FIG. 1, four the semiconductor memory devices SMD1 to SMD4 are shown, the present disclosure is not limited thereto. It will be understood that a number of the semiconductor memory devices connected to the channel CH may vary depending on implementations.

Each of the first to fourth semiconductor memory devices SMD1 to SMD4 may receive each of first to fourth chip selection signals CE1 to CE4. The first to fourth chip selection signals CE1 to CE4 may be provided from the controller 1200. The first to fourth semiconductor memory devices SMD1 to SMD4 may be selected through the first to fourth chip selection signals CE1 to CE4 respectively. The first to fourth semiconductor memory devices SMD1 to SMD4 may operate, when a corresponding chip selection signal is enabled, in a first mode where a communication between the memory device and the controller 1200 is allowed. The first to fourth semiconductor memory devices SMD1 to SMD4 may operate, when a corresponding chip selection signal is disabled, in a second mode where a communication between the memory device and the controller 1200 is disallowed. For instance, when the controller 1200 enables one of the first to fourth chip selection signals CE1 to CE4, one of the first to fourth semiconductor memory devices SMD1 to SMD4 corresponding to the enabled chip selection signal may exchange a command, address, and/or data through the channel CH with the controller 1200. One of the first to fourth semiconductor memory devices SMD1 to SMD4 corresponding to the disabled chip selection signal may not communicate with the controller 1200. This means that one of the first to fourth semiconductor memory devices SMD1 to SMD4 corresponding to the enabled chip selection signal may occupy the common channel CH while one of the first to fourth semiconductor memory devices SMD1 to SMD4 corresponding to the disabled the chip selection signal may not occupy the common channel CH. In this approach, the first to fourth semiconductor memory devices SMD1 to SMD4 may communicate with the controller 1200 through the single common channel CH.

The first to fourth semiconductor memory devices SMD1 to SMD4 may be coupled to a common ready-busy line RBL. Each of the first to fourth semiconductor memory devices SMD1 to SMD4 may generate a ready-busy signal to indicate whether it is in a ready or busy state, and output the generated ready-busy signal through the ready-busy line RBL.

The ready state of a semiconductor memory device may mean that the semiconductor memory device completes its internal operation and is currently ready to operate. For instance, the internal operation may include a program operation, read operation, or erase operation instructed by the controller 1200.

The busy state of a semiconductor memory device may mean that the semiconductor memory device is currently executing its internal operation.

Differently from the embodiment of the present disclosure, when multiple semiconductor memory devices are connected to dedicated ready-busy lines respectively, the number of the ready-busy lines increases. This may lead to an increase in the number of input/output pins of the controller 1200 and hence to an increase in area of the memory system 1000. In accordance with the embodiment of FIG. 1, the first to fourth semiconductor memory devices SMD1 to SMD4 may share the single ready-busy line RBL to reduce the memory system 1000 area.

The controller 1200 may control all operations of the semiconductor memory devices SMD1 to SMD4 over the common channel CH. The controller 1200 may interface between the semiconductor memory devices SMD1 to SMD4 and a host (system). In one implementation, the controller 1200 may be embodied in a firmware.

In response to a request from the host system or a request internally created from the controller 1200, the controller 1200 may instruct the semiconductor memory devices SMD1 to SMD4 over the common channel CH. The controller 1200 may instruct the semiconductor memory devices SMD1 to SMD4 to perform a program operation, read operation or erase operation, or the like.

The controller 1200 may send the first to fourth chip selection signals CE1 to CE4 to the first to fourth semiconductor memory devices SMD1 to SMD4 respectively.

During the program operation, the controller 1200 may enable one of the chip selection signals CE1 to CE4 to select one of the semiconductor memory devices SMD1 to SMD4. Then, the controller 1200 may provide a program command, address and data to be stored for the selected semiconductor memory device over the common channel CH. Next, the selected semiconductor memory device may program the data into a storage region indicated by the address.

During the read operation, the controller 1200 may enable one of the chip selection signals CE1 to CE4 to select one of the semiconductor memory devices SMD1 to SMD4. Then, the controller 1200 may provide a read command and an associated address for the selected semiconductor memory device over the common channel CH. Next, the selected semiconductor memory device may read data from a storage region indicated by the address and output the read data to the controller 1200 over the channel CH.

During the erase operation, the controller 1200 may enable one of the chip selection signals CE1 to CE4 to select one of the semiconductor memory devices SMD1 to SMD4. Then, the controller 1200 may provide an erase command and an associated address for the selected semiconductor memory device over the common channel CH. Next, the selected semiconductor memory device may erase data from a storage region indicated by the address.

The controller 1200 may be connected to the semiconductor memory devices SMD1 to SMD4 through the ready-busy line RBL. The controller 1200 may receive ready-busy signals from the semiconductor memory devices SMD1 to SMD4 over the ready-busy line RBL, and determine which one of the first to fourth semiconductor memory devices SMD1 to SMD4 is in a ready state based on the ready-busy signals. After this, the controller 1200 may select one of the first to fourth semiconductor memory devices SMD1 to SMD4 of the ready state and instruct the selected semiconductor memory device. For instance, the controller 1200 may instruct the selected semiconductor memory device to perform a program operation, read operation or erase operation.

Figure 2:
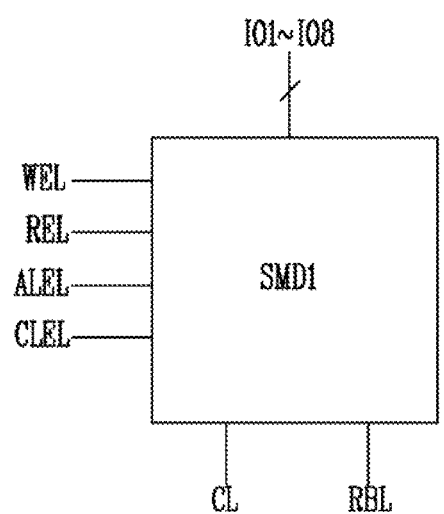
FIG. 2 is a block diagram of a single semiconductor memory device from among multiple semiconductor memory devices.

FIG. 2 is a block diagram of one semiconductor memory device SMD1 from among the semiconductor memory devices SMD1 to SMD4.

Referring to FIG. 2, the semiconductor memory device SMD1 may include input/output lines IO1 to IO8, the chip selection line CL, a ready-busy line RBL, a write enable line WEL, a read enable line REL, an address latch enable line ALEL, and a command latch enable line CLEL.

The input/output lines IO1 to IO8 may be connected to the channel CH. The semiconductor memory device SMD1 may communicate with the controller 1200 over the input/output lines IO1 to IO8 and the channel CH.

The semiconductor memory device SMD1 may receive a corresponding chip selection signal CE1 through the chip selection line CL. The semiconductor memory device SMD1 may output a ready-busy signal over the ready-busy line RBL.

It may be appreciated that although not shown in FIG. 1, the semiconductor memory device SMD1 may be connected to the controller 1200 through the write enable line WEL, read enable line REL, address latch enable line ALEL, and command latch enable line CLEL. In one implementation, the semiconductor memory devices SMD1 to SMD4 sharing the single channel CH may share the write enable line WEL, read enable line REL, address latch enable line ALEL, and command latch enable line CLEL respectively.

A write enable signal, read enable signal, address latch enable signal, and command latch enable signal may be provided from the controller 1200 to each of the first to fourth semiconductor memory devices SMD1 to SMD4 through the write enable line WEL, the read enable line REL, the address latch enable line ALEL, and the command latch enable line CLEL, respectively.

Enablement of the write enable signal may lead to data transmission from the controller 1200 to the selected semiconductor device through the channel CH. For example, when the first chip selection signal CE1 is enabled and the write enable signal is enabled, data may be transmitted from the controller 1200 to the first semiconductor memory device SMD1 through the channel CH.

Enablement of the read enable signal may lead to data transmission from a selected semiconductor memory device. For example, when the first chip selection signal CE1 is enabled and the read enable signal is enabled, data may be transmitted from the first semiconductor memory device SMD1 to the controller 1200 through the channel CH.

It may be noted that when the corresponding chip selection signal CE1 is enabled but the write enable signal and read enable signal both are not enabled, data may not be transferred between the first semiconductor memory device SMD1 and the controller 1200.

When the address latch enable signal is enabled, an associated address may be sent to the selected semiconductor memory device over the channel CH. When the command latch enable signal is enabled, an associated command may be sent to the selected semiconductor memory device over the channel CH.

When the first chip selection signal CE1, the write enable signal, and the command latch enable signal are enabled, then the first semiconductor memory device SMD1 may receive a command from the controller 1200 over the channel CH. For instance, when the write enable signal is toggled, the first semiconductor memory device SMD1 may obtain the command.

When the first chip selection signal CE1, the write enable signal, and the address latch enable signal are enabled, the first semiconductor memory device SMD1 may receive an address from the controller 1200 over the channel CH. For instance, when the write enable signal is toggled, the first semiconductor memory device SMD1 may obtain the address.

When the first chip selection signal CE1 and the write enable signal are enabled while the address latch enable signal and command latch enable signal are disabled, the first semiconductor memory device SMD1 may receive data to be stored from the controller 1200 over the channel CH. For instance, when the write enable signal is toggled, the first semiconductor memory device SMD1 may obtain data to be stored.

When the chip selection signal CE1 and the read enable signal are enabled, the first semiconductor memory device SMD1 may send data to the controller 1200 through the channel CH. For instance, the first semiconductor memory device SMD1 may output stored data in response to the read enable signal.

Figure 3:
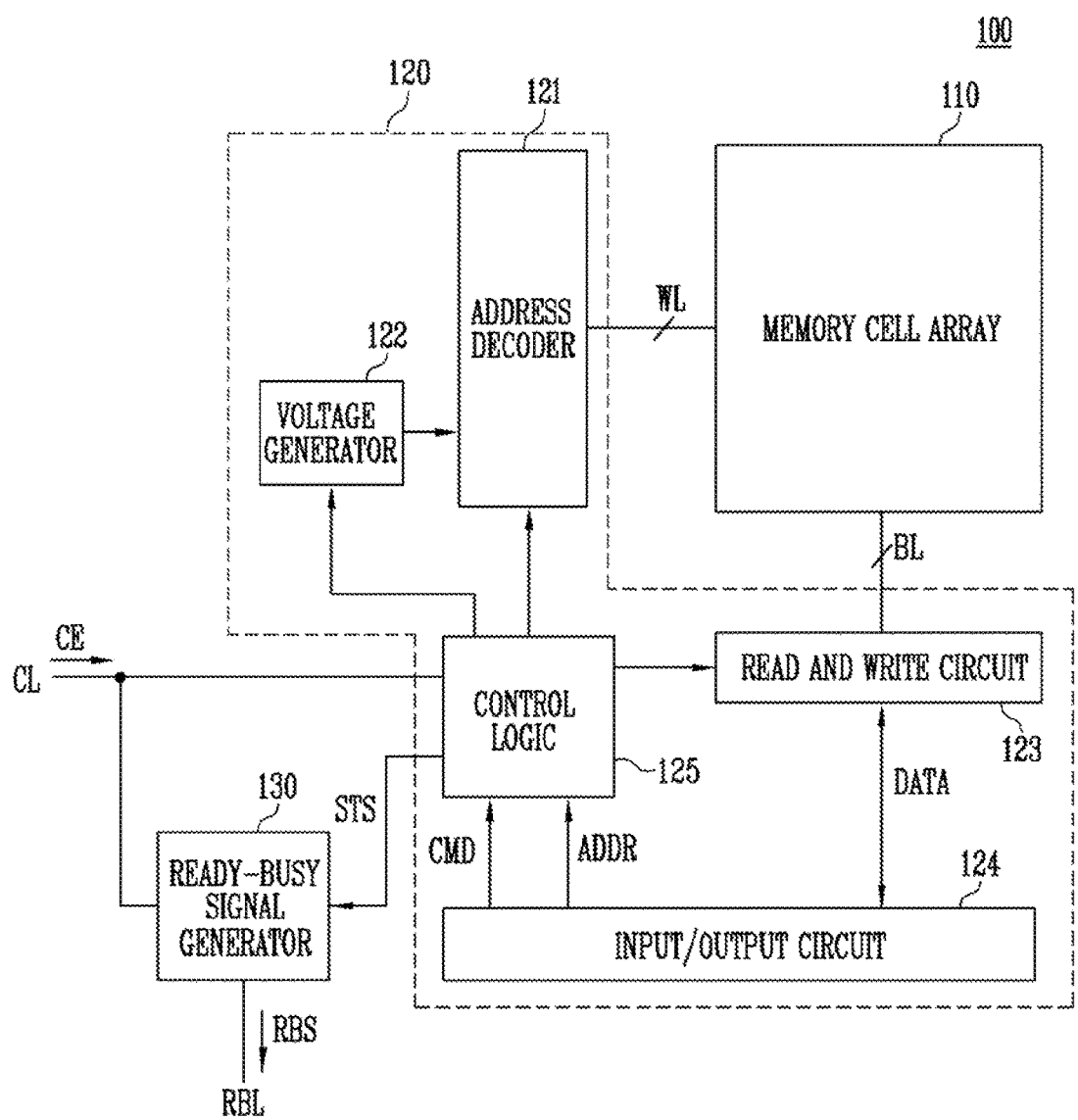
FIG. 3 is a block diagram of one embodiment of the semiconductor memory devices.

FIG. 3 is a block diagram of one embodiment of the respective semiconductor memory devices SMD1 to SMD4.

Referring to FIG. 3, the semiconductor memory device 100 may include a memory cell array 110, a peripheral circuit 120 and the ready-busy signal generator 130.

The memory cell array 110 may be connected to an address decoder 121 through word-lines WL. The memory cell array 110 may be coupled to a read and write circuit 123 through bit-lines BL.

The memory cell array 110 may include a plurality of memory blocks. Each of the plurality of memory blocks may include a plurality of pages. Each of the plurality of pages may include a plurality of memory cells. In one implementation, the plurality of memory cells may be embodied in non-volatile memory cells. In one implementation, each memory cell may be embodied in a single level cell or multi-level cells configuration.

The peripheral circuit 120 may include the address decoder 121, a voltage generator 122, a read and write circuit 123, an input/output circuit 124, and a control logic 125.

The address decoder 121 may be connected to the memory cell array 110 through the word-lines WL. The address decoder 121 may control the word-lines WL under the control of the control logic 125. The address decoder 121 may receive an address ADDR from the control logic 125.

In one implementation, the semiconductor memory device 100 may perform the program and read operations on a page basis. During the program operation and/or read operations, the address ADDR may include a block address and a row address. The address decoder 121 may decode the block address from the provided address ADDR. The address decoder 121 may select a single memory block according to the decoded block address. The address decoder 121 may further decode the row address from the provided address ADDR. The address decoder 121 may select one of the word-lines for the selected memory block according to the decoded row address. In this way, a single page may be selected.

In one implementation, during the erase operation, the address ADDR may include the block address. The address decoder 121 may decode the block address, and select a single memory block according to the decoded block address.

In one implementation, the address decoder 121 may include a block decoder, a row decoder and an address buffer, etc.

The voltage generator 122 may operate under the control of the control logic 125. The voltage generator 122 may generate an internal supply voltage using an external supply voltage fed to the semiconductor memory device 100. For instance, the voltage generator 122 may generate an internal supply voltage through a regulation of an external supply voltage. The generated internal supply voltage may be fed to the address decoder 121, the read and write circuit 123, the input/output circuit 124, the control logic 125 and the ready-busy signal generator 130 which may employ the internal voltage as an operation voltage for the semiconductor memory device 100.

The voltage generator 122 may generate a plurality of voltages using the external voltage and/or internal voltage. In one implementation, the voltage generator 122 may include a plurality of pumping capacitors to receive the internal voltage. The generator 122 may generate a plurality of voltages through a selective activation of the pumping capacitors under the control of the control logic 125. For instance, the voltage generator 122 may generate a variety of voltages to be applied to the word-lines WL, and output the generated voltages to the address decoder 121.

The read and write circuit 123 may be connected to the memory cell array 110 through the bit-lines BL. The read and write circuit 123 may operate under the control of the control logic 125.

During the program operation, the read and write circuit 123 may send data to be stored DATA from the input/output circuit 124 to the bit-lines BL. Based on the data DATA, memory cells are selected and then programmed. During the read operation, the read and write circuit 123 may read stored data from selected memory cells through the bit-lines BL, and output the data DATA to the input/output circuit 124. During the erase operation, the read and write circuit 123 may float the bit-lines BL.

In one implementation, the read and write circuit 123 may include page buffers or page registers, row selection circuit, or etc.

The control logic 125 may be connected to the address decoder 121, the voltage generator 122, the read and write circuit 123, the input/output circuit 124, and the ready-busy signal generator 130. The control logic 125 may receive a command CMD and an address ADDR from the input/output circuit 124. The control logic 125 may control all operations of the semiconductor memory device 100 in response to the command CMD. The control logic 125 may send the address ADDR to the address decoder 121.

The control logic 125 may be connected to the chip selection line CL. The control logic 125 may control the peripheral circuit 120 or input/output circuit 124 to operate in the first mode when the chip selection signal CE is enabled. In the first mode, the associated semiconductor device may communicate with an external device e.g., the controller 1220. The control logic 125 may control the peripheral circuit 120 or input/output circuit 124 to operate in the second mode when the chip selection signal CE is disabled. In the second mode, the associated semiconductor device may not communicate with the external device.

The control logic 125 may control the input/output circuit 124 to receive data in response to a toggling of the write enable signal when the chip selection signal CE is enabled. When the command latch enable signal is enabled, the control logic 125 may receive the command CMD. When the address latch enable signal is enabled, the control logic

125 may receive the address ADDR. When both of the command latch enable signal and address latch enable signal are not enabled, the control logic 125 may receive the data DATA to be stored and control the input/output circuit 124 to send the data DATA to the read and write circuit 123.

The control logic 125 may control the input/output circuit 124 to output stored data DATA to the external device in response to a toggling of the read enable signal when the chip selection signal CE is enabled.

On the other hand, the control logic 125 may generate a state signal STS based on an operation state of the semiconductor memory device 100 and output the generated state signal STS to the ready-busy signal generator 130. The state signal STS may indicate whether the peripheral circuit 120 is in a ready or busy state. For instance, the control logic 125 may enable the state signal STS when the peripheral circuit 120 is performing an internal operation or the peripheral circuit 120 is in the busy state. The control logic 125 may disable the state signal STS when the peripheral circuit 120 completes the Internal operation of the peripheral circuit 120 is in the ready state.

The ready-busy signal generator 130 may be connected to the chip selection line CL. In one embodiment of the present disclosure, the ready-busy signal generator 130 may bias the ready-busy line RBL according to the state signal STS when the provided chip selection signal CE is enabled. A voltage biased to the ready-busy line RBL may serve as a ready-busy signal RBS. In terms of the ready-busy signal generator 130, detailed descriptions will be made with reference to FIG. 5 and FIG. 6.

In one implementation, the semiconductor memory device 100 may be embodied in a flash memory device.

Figure 4:
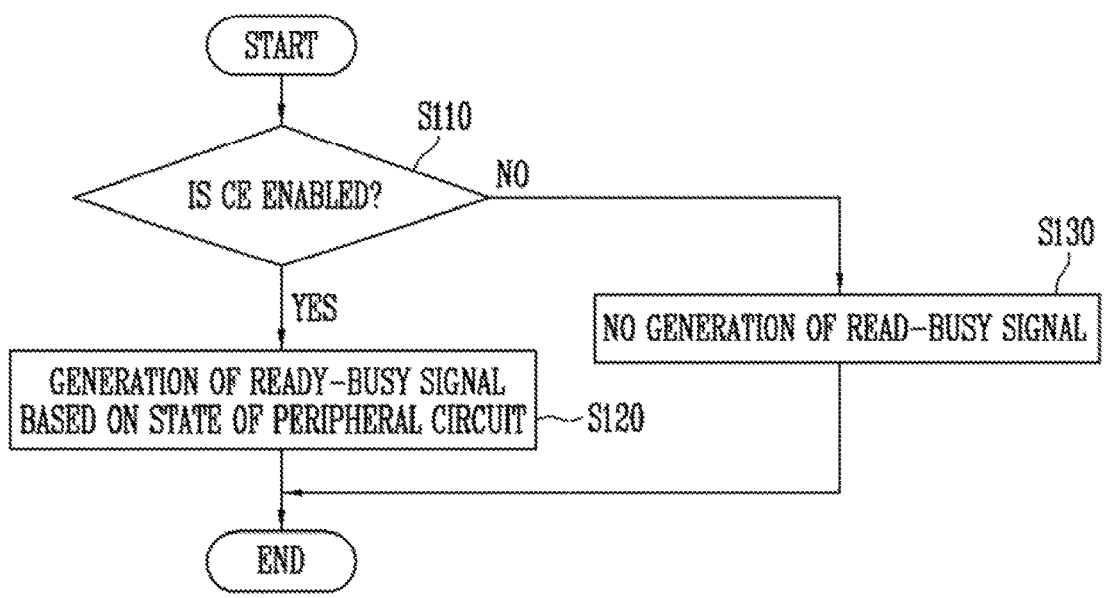
FIG. 4 is a flow-diagram of an operation method of the semiconductor memory device in FIG. 3.

FIG. 4 is a flow-diagram of an operation method of the semiconductor memory device 100 in FIG. 3.

Referring to FIG. 3 and FIG. 4, at step S110, a determination may be made as to whether the chip selection signal CE corresponding to the semiconductor memory device 100 is enabled or not. When the chip selection signal CE is enabled, the method proceeds to step S120. When the chip selection signal CE is not enabled, the method proceeds to step S130.

At step S120, based on whether the peripheral circuit 120 is in the ready or busy state, the ready-busy signal RBS is generated. That is, the ready-busy signal RBS may be fed when the chip selection signal CE is enabled. In one implementation, when the chip selection signal CE is enabled, the ready-busy line RBL may be enabled or disabled.

At step S130, the ready-busy signal RBS is not generated. In one implementation, when the chip selection signal CE is not enabled, the ready-busy line RBL may be disabled, regardless of whether the peripheral circuit 120 is in a ready or busy state.

Referring again to FIG. 1, in order to determine whether a single semiconductor memory device is in the ready or busy state, the controller 1200 may enable the chip selection signal CE corresponding to the semiconductor memory device among the chip selection signals CE1 to CE4, and disable the chip selection signals corresponding to the other semiconductor memory devices. In one implementation, the write enable signal and read enable signal may be disabled. In this case, although the chip selection signal CE is enabled, the controller 1200 may not communicate with the corresponding semiconductor memory device over the common channel CH. The ready-busy signal generator 130 of the corresponding semiconductor memory device may output the ready-busy signal RBS in response to the enablement of the chip selection signal CE. The other semiconductor memory devices other than the semiconductor memory device selected by the chip selection signal CE may not output the ready-busy signal RBS since their corresponding chip selection signals are disabled. Accordingly, the controller 1200 may reference the selected single semiconductor memory device while the semiconductor memory devices SMD1 to SMD4 are sharing the ready-busy line RBL.

Alternatively, it may be assumed that each of the semiconductor memory devices SMD1 to SMD4 may output a ready-busy signal RBS regardless of the chip selection signal CE. That is, each of the semiconductor memory devices SMD1 to SMD4 may bias the ready-busy line RBL based on an operation state thereof. For instance, the semiconductor memory device in the busy state may bias the ready-busy line RBL to a ground voltage while the semiconductor memory device in the ready state may float the ready-busy line RBL. In this case, when at least one of the semiconductor memory devices SMD1 to SMD4 is in the busy state, the ready-busy line RBL may be biased to the ground voltage. When all of the semiconductor memory devices SMD1 to SMD4 are in the ready state, the ready-busy line RBL may be floated. Therefore, when at least one of the semiconductor memory devices SMD1 to SMD4 is in the busy state, it is impossible to find which one of the remaining ones among the semiconductor memory devices SMD1 to SMD4 are in the busy state or ready state through the ready-busy line RBL. Thus, the controller 1200 may not determine which one of the semiconductor memory devices SMD1 to SMD4 is in the ready state due to the busy state of part of the semiconductor memory devices SMD1 to SMD4 even when remaining part of the semiconductor memory devices SMD1 to SMD4 are in a ready state. For this reason, the controller 1200 may not immediately instruct a new operation for the semiconductor memory device in the ready state.

Also, it may be assumed that the controller 1200 may determine the operation state of each of the semiconductor memory devices SMD1 to SMD4 through transmission of state read commands through the channel CH. For instance, the controller 1200 may enable one of the chip selection signals CE1 to CE4 and may perform the state read operation for the corresponding semiconductor memory device through the channel CH. A repetition of such state read operation may lead to an increase in a load of the channel CH. For instance, the repetitive state read operations for checking the operation state of a certain semiconductor device may lead to a decrease in a communication time between the controller 1200 and the remaining semiconductor memory devices over the common channel CH.

In accordance with one embodiment of the present disclosure, the semiconductor memory device 100 may output the ready-busy signal RBS in response to the chip selection signal CE. The controller 1200 may determine according to the ready-busy signal RBS the operation state of the semiconductor memory devices SMD1 to SMD4 corresponding to the enabled chip selection signal CE enabled. Thus, the controller 1200 may select one of the semiconductor memory devices SMD1 to SMD4 and immediately reference the operation state of the selected semiconductor memory device while the semiconductor memory devices SMD1 to SMD4 are sharing the single ready-busy line RBL. As a result, the memory system 1000 may have an enhanced operation rate.

FIG. 5 is a block diagram of one embodiment of the ready-busy signal generator 130 in FIG. 3.

Referring to FIG. 5, the ready-busy signal generator 130 may include a ready-busy signal generation module 131, a chip selection signal detector 132, and a 3-states buffer.

The ready-busy signal generation module 131 may receive the state signal STS. The ready-busy signal generation module 131 may output the state signal STS through a first output node NDa thereof. For instance, when the state signal STS is enabled, the first output node NDa may have a logical value 'High'. When the state signal STS is disabled, the first output node NDa may have a logical value 'Low'. The ready-busy signal generation module 131 may output a constant voltage through a second output node NDb thereof. For instance, the constant voltage may be a ground voltage.

The chip selection signal detector 132 may output the state signal STS of the first output node NDa to a switching node NDc when the chip selection signal CE is enabled. The chip selection signal detector 132 may block the state signal STS of the first output node NDa when the chip selection signal CE is disabled. The chip selection signal detector 132 may include an inverter 133 and an AND gate 134. The inverter 133 may invert the chip selection signal CE and output the inverted chip selection signal CE to the AND gate 134. In one implementation, the chip selection signal CE may be enabled to be a logical value 'Low'. The inverter 133 may output a logical value 'High' to the AND gate 134 when the chip selection signal CE has a logical value 'Low'. Thus, the AND gate 134 may output the state signal STS of the first output node NDa to the switching node NDc when the chip selection signal CE is enabled. When the chip selection signal CE is disabled, the state signal STS of the first output node NDa may be blocked.

The 3-states buffer 135 may electrically couple the second output node NDb and the ready-busy line RBL according to a logical value of the switching node NDc. The 3-states buffer 135 may output a constant voltage, e.g., the ground voltage, from the second output node NDb to the ready-busy line RBL when the logical value of the switching node NDc is 'High'. The ready-busy signal RBS may be enabled as a logical value 'Low'. The 3-states buffer 135 may float the ready-busy line RBL when the logical value of the switching node NDc is 'Low'. For instance, the ready-busy line RBL may be coupled to a high impedance. The ready-busy signal RBS may be disabled as floated.

That is, when the chip selection signal CE is enabled, the constant voltage of second output node NDb may be outputted to the ready-busy line RBL or the ready-busy line RBL may be floated according to the state signal STS.

FIG. 6 illustrates a table of outputs of the ready-busy signal generator 130 based on the chip selection signal CE.

Referring to FIG. 6, when the chip selection signal CE is enabled to have a logical value 'Low', the ready-busy signal RBS depends on the state signal STS. When the semiconductor memory device 100 falls in the busy state and thus the state signal STS has a logical value 'High', the ready-busy signal RBS may be enabled to have a logical value 'Low'. When the semiconductor memory device 100 falls in the ready state and thus the state signal STS has a logical value 'Low', the ready-busy signal RBS may be disabled as floated.

To the contrary, when the chip selection signal CE is disabled to have a logical value 'High', the ready-busy signal RBS may be disabled as floated regardless of the state signal STS.

Figure 7:
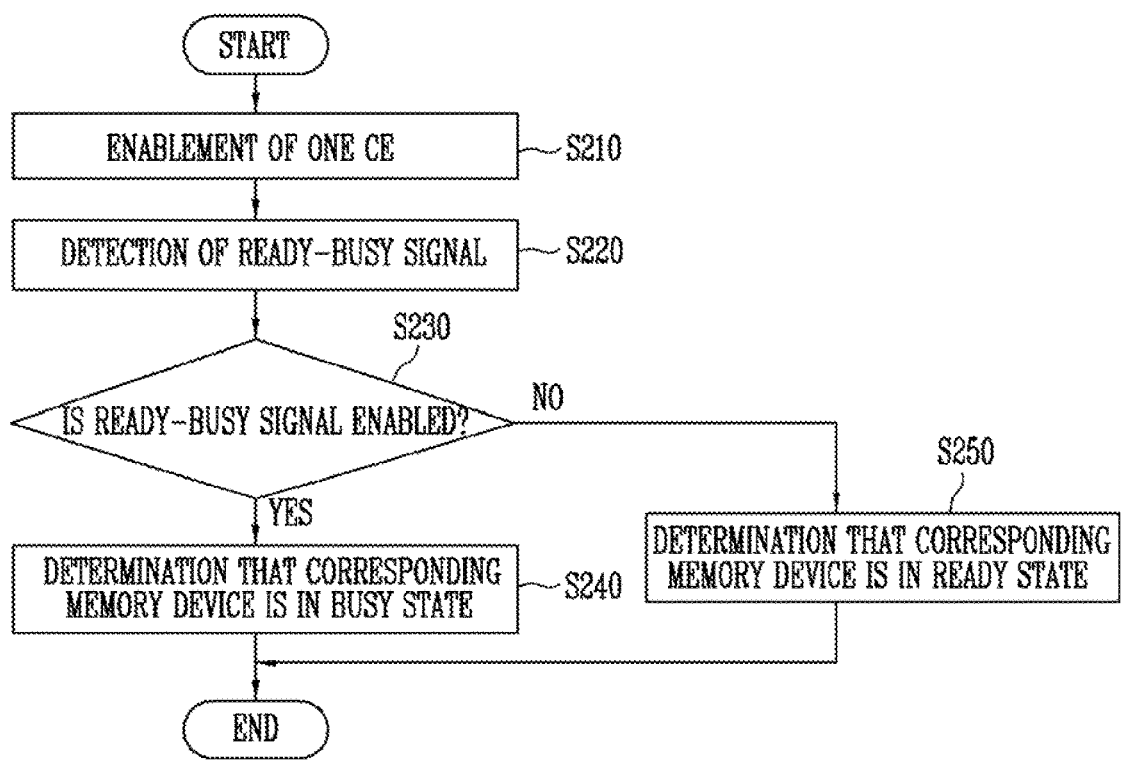
FIG. 7 is a flow-diagram of an operation method of a controller of FIG. 1.

FIG. 7 is a flow-diagram of an operation method of the controller 1200 of FIG. 1.

Referring to FIG. 1 and FIG. 7, at step S210, the controller 1200 may enable any one of the chip selection signals CE1 to CE4. Then, the controller 1200 may disable a write enable signal and read enable signal. Therefore, without data communication through the channel CH, the chip selection signal CE may be provided to determine the operation state of the semiconductor memory device.

At step S220, the controller 1200 may detect a ready-busy signal RBS transmitted through the ready-busy line RBL. The ready-busy signal RBS may be transmitted through the ready-busy line RBL from one of the first to fourth semiconductor memory devices SMD1 to SMD4 corresponding to the enabled chip selection signal CE.

At step S230, the controller 1200 may determine whether the ready-busy signal RBS is enabled or not. For instance, the ready-busy signal RBS may be enabled to have a logical value 'Low', and may be disabled as floated.

At step S240, the controller 1200 may determine that the corresponding semiconductor memory device is in the busy state when the ready-busy signal RBS is enabled. At step S250, the controller 1200 may determine that the corresponding semiconductor memory device is in the ready state when the ready-busy signal RBS is disabled.

Figure 8:
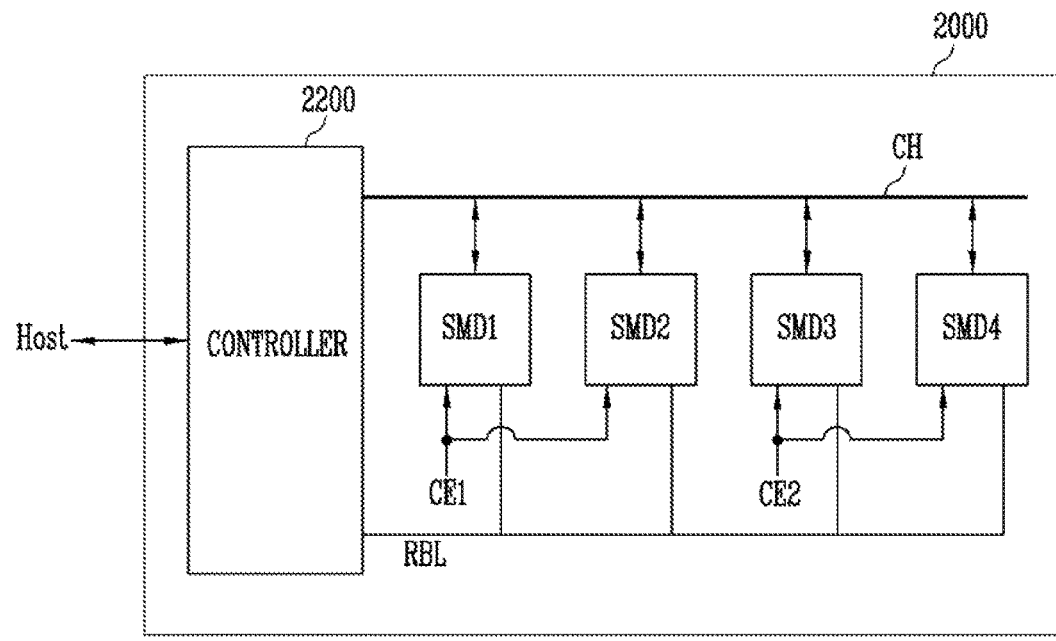
FIG. 8 is a block diagram of a memory system in accordance with one implementation of the present disclosure.

FIG. 8 is a block diagram of a memory system 2000 in accordance with one implementation of the present disclosure.

Referring to FIG. 8, the memory system 2000 may include a plurality of the semiconductor memory devices SMD1 to SMD4 and a controller 2200.

First to fourth semiconductor memory devices SMD1 to SMD4 may communicate with the controller 1200 through a single common channel CH. The first to fourth semiconductor memory devices SMD1 to SMD4 may be coupled to a common ready-busy line RBL.

Differently from the memory system 1000 described with reference to FIGS. 1 to 7, the first to fourth semiconductor memory devices SMD1 to SMD4 may be divided into a plurality of memory groups, and semiconductor memory devices in each memory group may share a single chip selection signal CE. In an example of FIG. 8, first and second semiconductor memory devices SMD1, and SMD2 may share a first chip selection signal CE1, while third and fourth semiconductor memory devices SMD3, and SMD4 may share a second chip selection signal CE2.

In one implementation, controller 2200 may select a single memory group through enablement of a single chip selection signal CE. Then, the controller 2200 may select a single semiconductor memory device from the selected memory group by adding data bits to an address ADDR to indicate the semiconductor memory device in the selected memory group.

Figure 9:
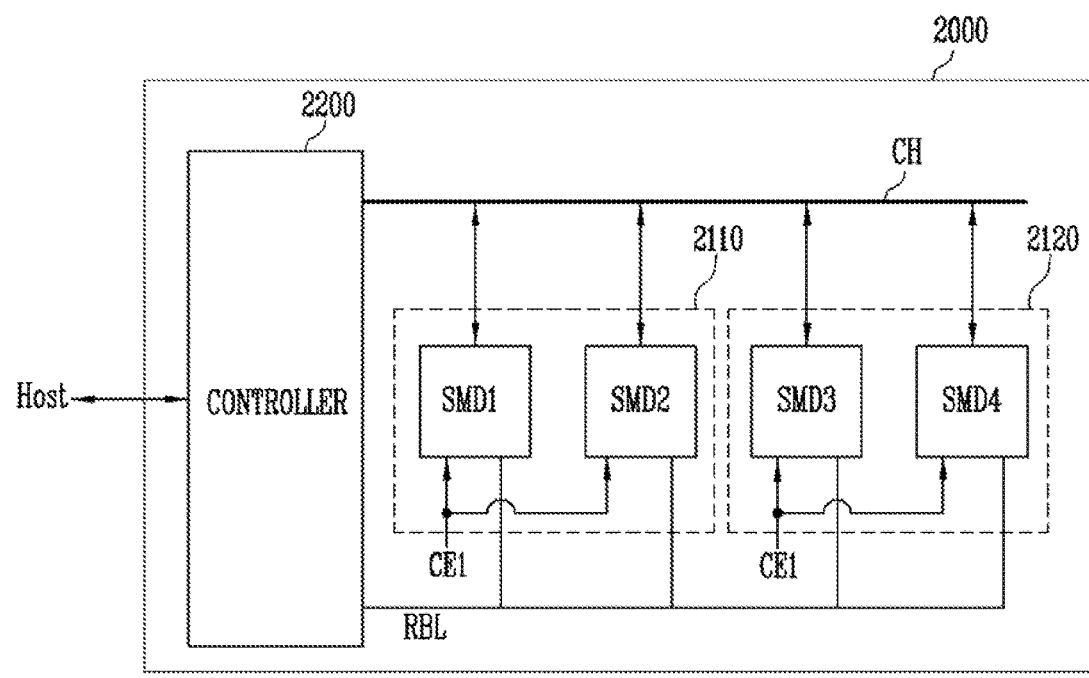
FIG. 9 is a block diagram of a variation of a memory system in FIG. 8.

FIG. 9 is a block diagram of a variation of the memory system 2000 in FIG. 8.

Referring to FIG. 9, a single memory group may be implemented in a single package. In FIG. 9, first and second semiconductor memory devices SMD1, and SMD2 may form a first memory group 2110 to be implemented in a single package. Also, third and fourth semiconductor memory devices SMD3, and SMD4 may form a second memory group 2120 to be implemented in another single package. In one implementation, each memory group may embody a single logical unit LUN.

Figure 10:
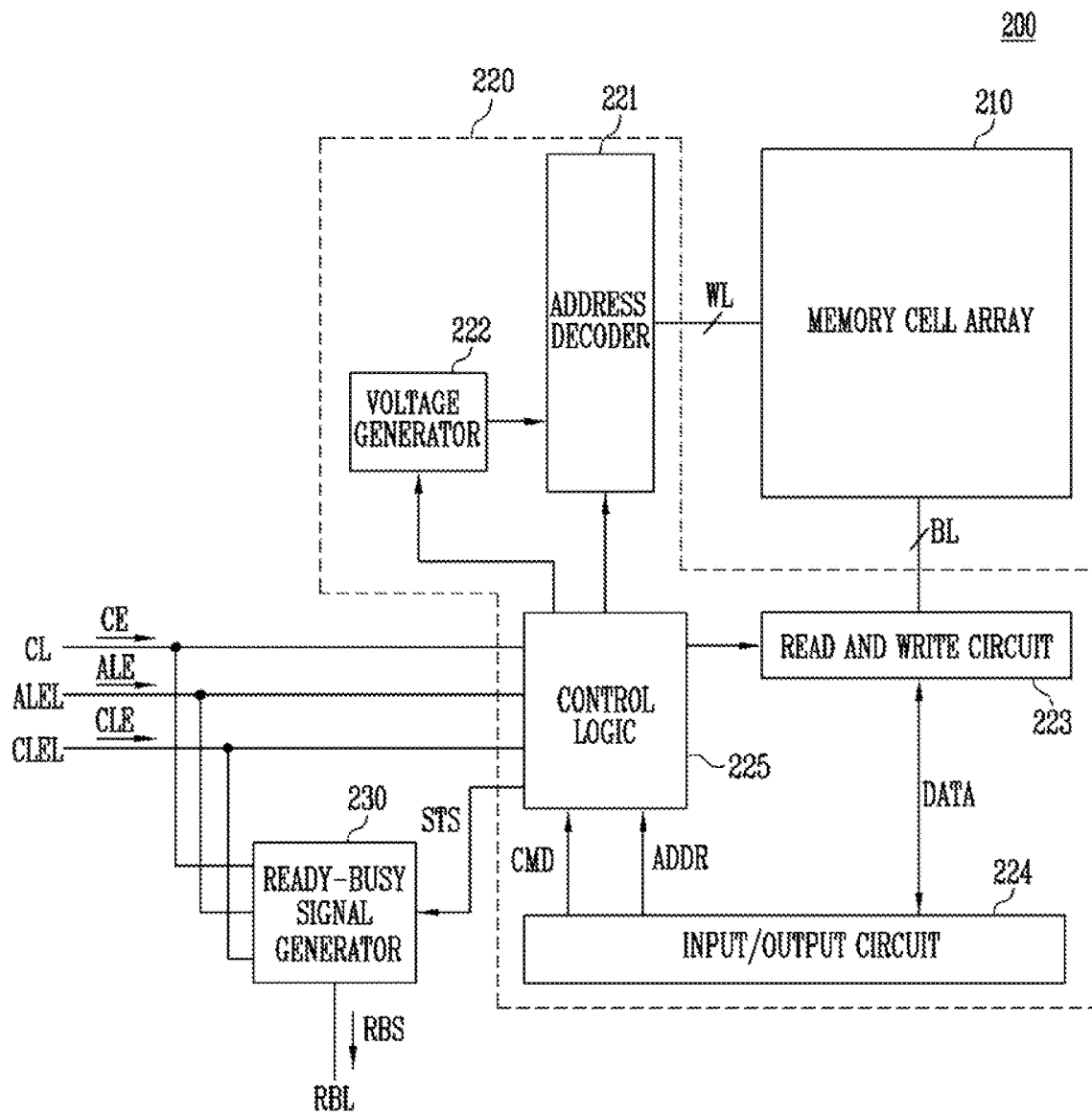
FIG. 10 is a block diagram of an embodiment of the semiconductor memory devices in FIG. 8.

FIG. 10 is a block diagram of an embodiment 200 of each of the semiconductor memory devices SMD1 to SMD4 in FIG. 8.

Referring to FIG. 10, the semiconductor memory device 200 may include a memory cell array 210, a peripheral circuit 220, and a ready-busy signal generator 230. The peripheral circuit 220 may include an address decoder 221, a voltage generator 222, a read and write circuit 223, an input/output circuit 224, and a control logic 225. The address decoder 221, voltage generator 222, read and write circuit 223, input/output circuit 224, and control logic 225 may be similar to the address decoder 121, voltage generator 122, read and write circuit 123, input/output circuit 124, and control logic 125 described with reference to FIGS. 3 to 7.

The ready-busy signal generator 230 may be connected to a chip selection line CL, an address latch enable line ALEL, and a command latch enable line CLEL. Through the chip selection line CL, address latch enable line ALEL, and command latch enable line CLEL, the chip selection signal CE, the ready-busy signal generator 230 may receive address latch enable signal ALE, and command latch enable signal CLE, respectively. The chip selection signal CE, address latch enable signal ALE, and command latch enable signal CLE may be also fed to the control logic 225.

In one implementation of the present disclosure, the ready-busy signal generator 230 may bias the ready-busy line RBL according to the state signal STS by referencing the chip selection signal CE, address latch enable signal ALE, and command latch enable signal CLE. The bias voltage applied to the ready-busy line RBL may serve as the ready-busy signal RBS.

Figure 11:
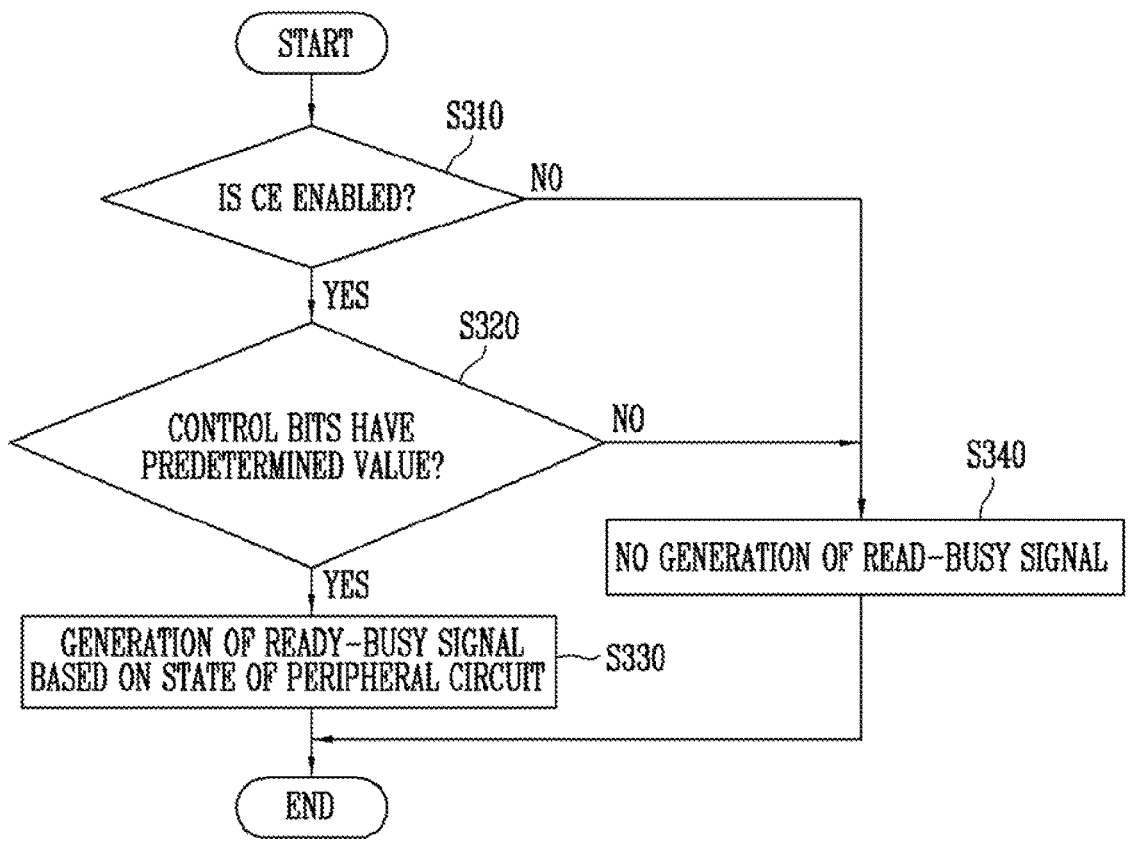
FIG. 11 is a flow-diagram of an operation method of a semiconductor memory device in FIG. 10.

FIG. 11 is a flow-diagram of an operation method of the semiconductor memory device 200 in FIG. 10.

Referring to FIG. 8 and FIG. 11, at step S310, a determination may be made whether a chip selection signal CE is enabled or not. When the chip selection signal CE is enabled, the method may proceeds to step S120. When the chip selection signal CE is not enabled, the method may proceed to step S130.

At step S320, a determination may be made whether control bits defined by the address latch enable signal ALE and the command latch enable signal CLE have a predetermined value. In a positive case, the method may proceed to step S330 while in a negative case the method may proceed to step S340.

In one implementation, the predetermined value may have a different value between the semiconductor memory devices. For instance, the first semiconductor memory device SMD1 may correspond to logical value '00'; the second semiconductor memory device SMD2 may correspond to logical value '01'; the third semiconductor memory device SMD3 may correspond to logical value '10'; and the fourth semiconductor memory device SMD4 may correspond to logical value '11'.

In this way, through the control bits, a semiconductor memory device in the selected memory group, which is selected through the chip selection signal CE, among the semiconductor memory devices SMD1 to SMD4 may be selected. Thus, while two or more semiconductor memory devices share a single chip selection signal CE, one of the semiconductor memory devices included in the selected memory group may be selected through the address latch enable signal and command latch enable signal.

At step S330, the ready-busy signal RBS may be generated depending on whether the peripheral circuit 120 is in the ready or busy state. At step S340, the ready-busy signal RBS may not be generated.

Figure 12:
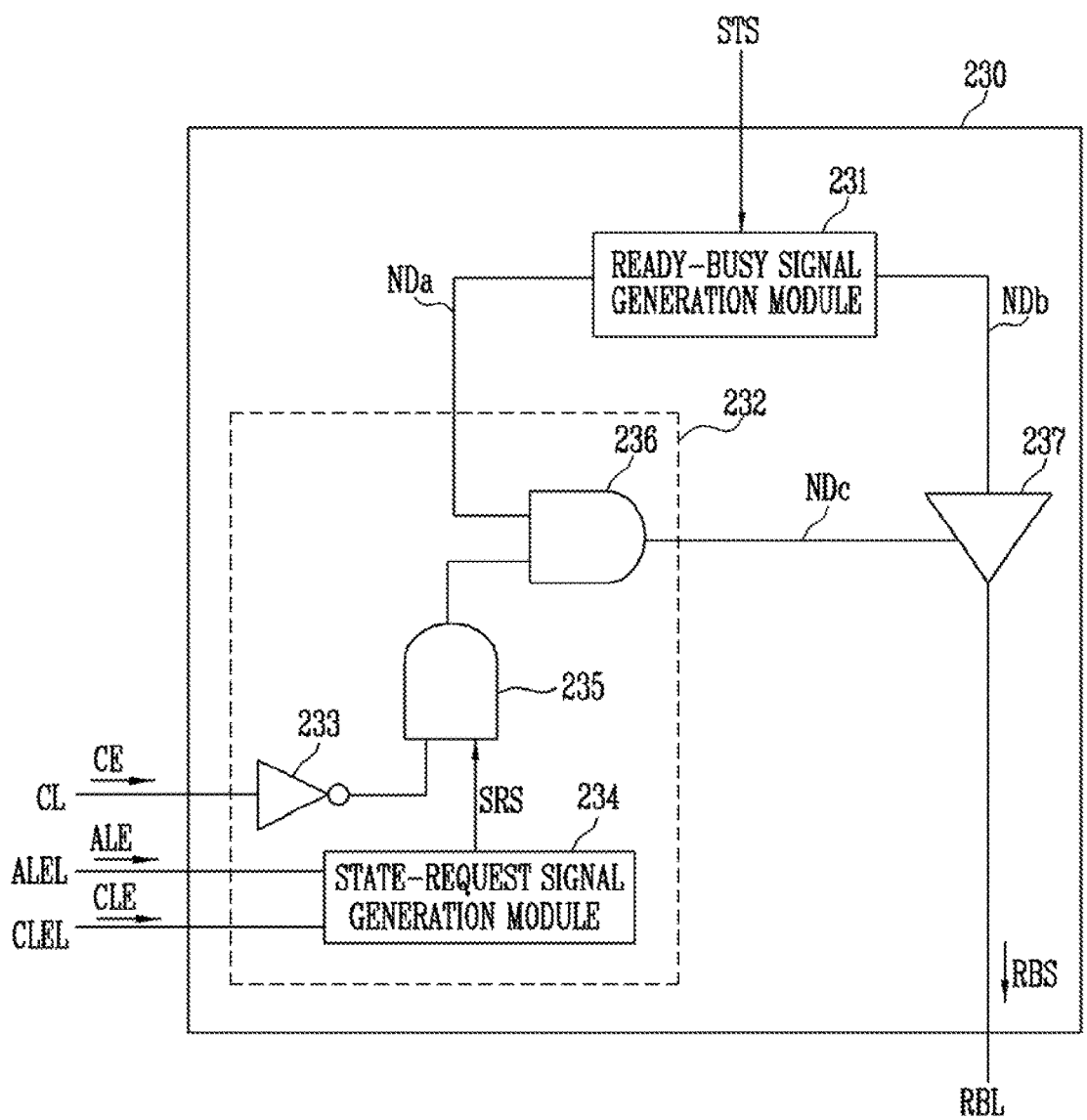
FIG. 12 is a block diagram of one embodiment of a ready-busy signal generator in FIG. 10.

FIG. 12 is a block diagram of one embodiment of the ready-busy signal generator 230 in FIG. 10.

Referring to FIG. 12, the ready-busy signal generator 230 may include a ready-busy signal generation module 231, a chip selection signal detector 232, and a 3-states buffer 237.

The ready-busy signal generation module 231 may receive the state signal STS. The ready-busy signal generation module 231 may output the state signal STS through a first output node NDa thereof, and may output a constant voltage, for instance, a ground voltage through a second output node NDb thereof.

The chip selection signal detector 232 may output the state signal STS from the first output node NDa to a switching node NDc when the chip selection signal CE is enabled and the control bits defined by the address latch enable signal ALE and command latch enable signal CLE have a predetermined value. The chip selection signal detector 232 may include an inverter 233, a state-request signal generation module 234, and first and second AND gates 235, 236. The inverter 233 may invert the chip selection signal CE and output the inverted chip selection signal CE to the first AND gate 235.

The state-request signal generation module 234 may enable a state-request signal SRS to have a logical value 'High' when the control bits defined by the address latch enable signal ALE and command latch enable signal CLE have a predetermined value. The state-request signal SRS may be transferred to the first AND gate 235. For instance, when the state-request signal generation module 234 is included in the first semiconductor memory device SMD1, a corresponding predetermined value may have a logical value '00'. When the state-request signal generation module 234 is included in the second semiconductor memory device SMD2, a corresponding predetermined value may have a logical value '01'. When the state-request signal generation module 234 is included in the third semiconductor memory device SMD3, a corresponding predetermined value may have a logical value '10'. When the state-request signal generation module 234 is included in the fourth semiconductor memory device SMD4, a corresponding predetermined value may have a logical value '11'.

The first AND gate 235 may apply an AND-operation to the inverted chip selection signal CE and state-request signal SRS. When the inverted chip selection signal CE has a logical value 'High' and the state-request signal SRS has a logical value 'High', the first AND gate 235 may output a logical value 'High'.

The second AND gate 236 may output the state signal STS from the first output node NDa to the switching node NDc when an output of the first AND gate 236 has a logical value 'High'. The second AND gate 236 may disallow outputting the state signal STS when an output of the first AND gate 236 has a logical value 'Low'.

The 3-states buffer 237 may electrically connect between the second output node NDb and the ready-busy line RBL according to a logical value at the switching node NDc.

When the chip selection signal CE is enabled and the control bits defined by the address latch enable signal ALE and command latch enable signal CLE have a predetermined value, a constant voltage (e.g., a ground voltage) may be output from the second output node NDb to the ready-busy line RBL, or the ready-busy line RBL may be floated according to the state signal STS.

FIG. 13 is a table of outputs of the ready-busy signal generator 230 based on the chip selection signal CE, address latch enable signal ALE, and command latch enable signal CLE.

Referring to FIG. 13, when the control bits defined by the address latch enable signal ALE and command latch enable signal CLE have a logical value '00', the ready-busy signal generator 230 may generate the ready-busy signal RBS as described above in connection to FIG. 6. It will be understood that although not shown in FIG. 13, when the control bits defined by the address latch enable signal ALE and command latch enable signal CLE do not have a logical value '00', the ready-busy signal generator 230 may disable the ready-busy signal RBS as floated regardless of the chip selection signal CE and state signal STS.

In accordance with implementations of the present disclosure, when a single chip selection signal CE may be shared between 2 or more semiconductor memory devices, one of the semiconductor memory devices may be selected through the address latch enable signal and command latch enable signal. Thus, the controller 2200 selects a single semiconductor memory device and immediately references an operation state of the selected semiconductor memory device without an additional line.

Figure 14:
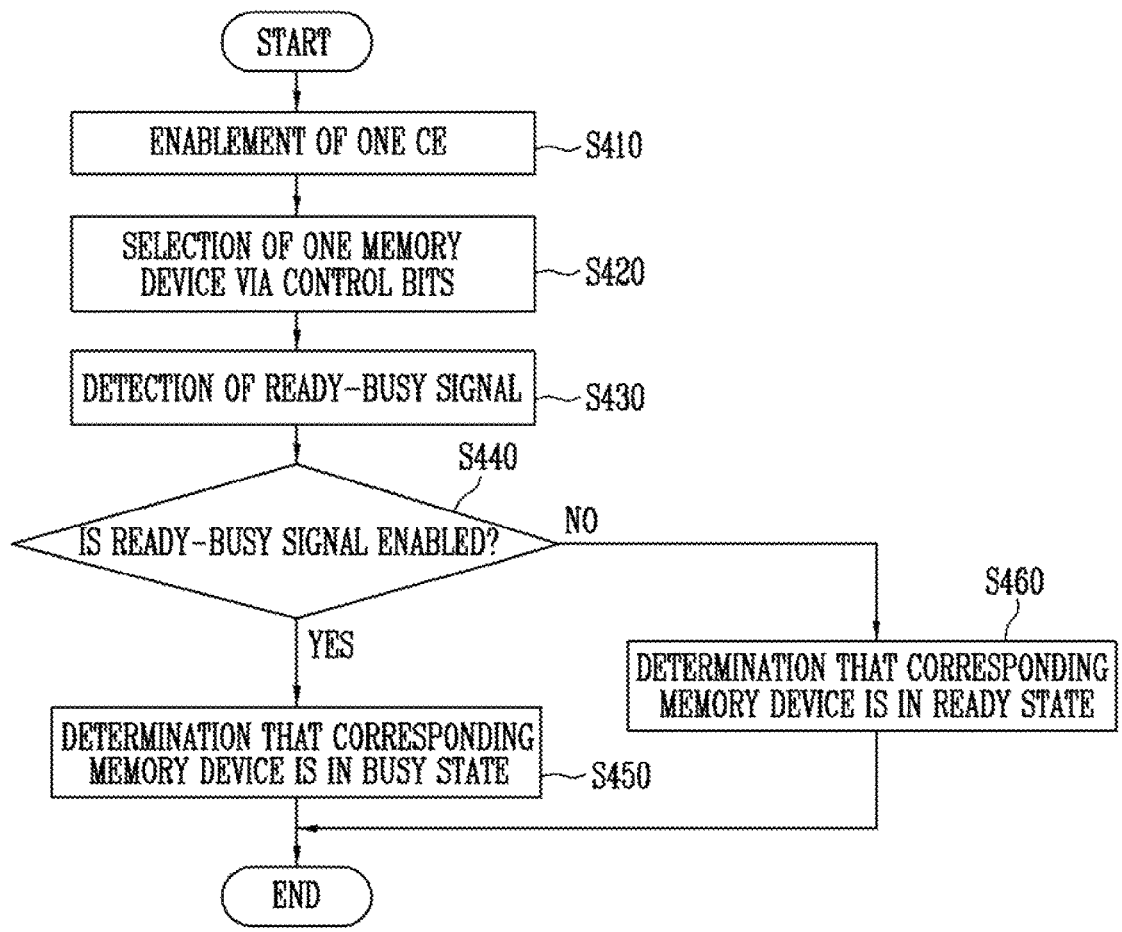
FIG. 14 is a flow diagram of an operation method of a controller in FIG. 8.

FIG. 14 is a flow diagram of an operation method of the controller 2200 in FIG. 8.

Referring to FIG. 8 and FIG. 14, at step S410, the controller 2200 may enable one of chip selection signals CE1 and CE2. In this time, the controller 2200 may disable a write enable signal and a read enable signal.

At step S420, the controller 2200 may output the address latch enable signal ALE and the command latch enable signal CLE, which includes the control bits having the predetermined value, to select a single semiconductor memory device included in the memory group selected through the enabled one of the chip selection signals CE1 and CE2.

At step S430, the controller 2200 may detect a ready-busy signal RBS transmitted through the ready-busy line RBL. At step S440, the controller 2200 may determine whether the ready-busy signal RBS is enabled or not. For instance, the ready-busy signal RBS may be enabled to have a logical value 'Low', and may be disabled as floated. At step S450, the controller 2200 may determine that the selected semiconductor memory device is in the busy state when the ready-busy signal RBS is enabled. At step S460, the controller 2200 may determine that the selected semiconductor memory device is in the ready state when the ready-busy signal RBS is disabled.

Figure 15:
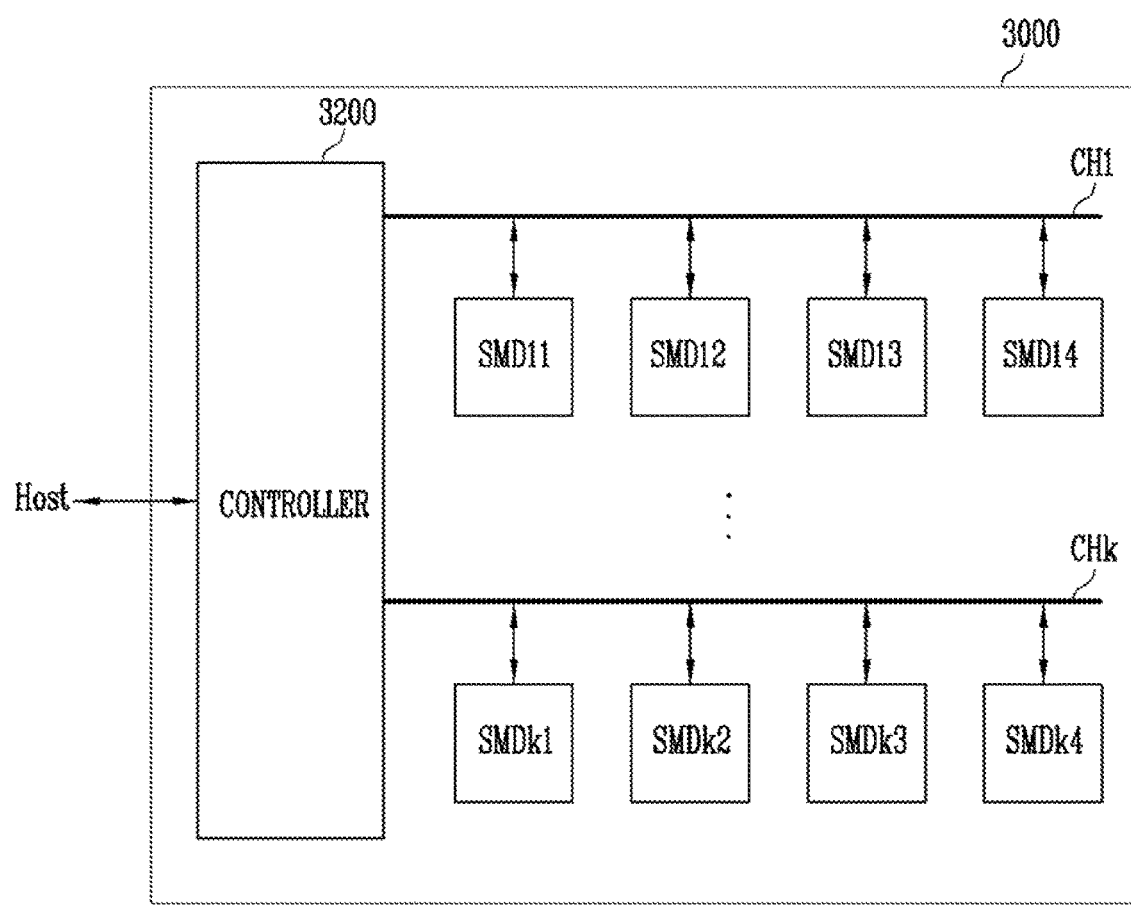
FIG. 15 is a block diagram of a memory system in accordance with one implementation of the present disclosure.

FIG. 15 is a block diagram of a memory system 3000 in accordance with one implementation of the present disclosure.

Referring to FIG. 15, the memory system 3000 may include a plurality of semiconductor memory devices SMD11 to SMD14, and SMDk1 to SMDk4 and a controller 3200. The plurality of the semiconductor memory devices SMD11 to SMD14, and SMDk1 to SMDk4 may be connected to the controller 3200 through first to k-th channels CH1 to CHk. The controller 3200 may control the semiconductor memory devices respectively through the first to k-th channels CH1 to CHk. In this approach, the memory system 3000 may supply a larger storage area.

It will be understood that although in FIG. 15, the ready-busy line RBL is omitted, the semiconductor memory devices sharing a single channel may be coupled to a single ready-busy line. Like the above-mentioned description in connection to FIG. 3, the controller 3200 may feed the chip selection signals to the semiconductor memory devices sharing the single channel. Like the above-mentioned descriptions in connection to FIG. 8 and FIG. 9, the semiconductor memory devices sharing the single channel may be divided into a plurality of memory groups, and, in this case, the controller 3200 may feed the chip enable signals respectively to the memory groups.

In accordance with the implementations of the present disclosure, the semiconductor memory device may output a ready-busy signal RBS in response to a chip selection signal. While the semiconductor memory devices share the ready-busy line, the controller may select a single semiconductor memory device and immediately reference an operation state of the selected semiconductor memory device. As a result, an enhanced operation rate may be achieved in a memory system.

Example embodiments of the present disclosure have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory system comprising:
a plurality of semiconductor memory devices sharing a single ready-busy line,
wherein each of the plurality of semiconductor memory devices comprises:
a plurality of memory cells;
a peripheral circuit configured to control the memory cells, and operate in first and second modes respectively corresponding to enablement and disablement of one of chip selection signals; and
a ready-busy signal generator configured to bias the single ready-busy line at a first level or a second level according to whether the peripheral circuit is in a ready or busy state during the enablement of the one of chip selection signals, and configured not to bias the single ready-busy line regardless of the peripheral circuit during the disablement of the one of the chip selection signals,
wherein communication between each of the plurality of semiconductor memory devices and an external device is allowed in the first mode, and
wherein the communication between each of the plurality of semiconductor memory devices and the external device is not allowed in the second mode.

2. The memory system of claim 1, wherein the ready-busy signal generator further disables the single ready-busy line regardless of whether the peripheral circuit is in the ready or busy state during the disablement of the one of chip selection signals.

3. The memory system of claim 1, wherein the ready-busy signal generator disables and enables the single ready-busy line according to the ready and busy states of the peripheral circuit, respectively, during the enablement of the one of chip selection signals.

4. The memory system of claim 1, wherein the ready-busy signal generator applies a bias voltage applied to the single ready-busy line as a ready-busy signal provided to the external device.

5. The memory system of claim 1,
wherein the ready-busy signal generator comprises a ready-busy signal generation module configured to output a state signal and a constant voltage respectively through first and second terminals thereof, and
wherein the state signal indicates whether the peripheral circuit is in the ready or busy state.

6. The memory system of claim 5, wherein the ready-busy signal generator outputs the constant voltage from the second terminal to the single ready-busy line according to the state signal at the first terminal during the enablement of the one of chip selection signals.

7. The memory system of claim 5, wherein the ready-busy signal generator further comprises:

a chip selection signal detector configured to allow and disallow outputting of the state signal from the first terminal to a third terminal thereof during the enablement and disablement of the one of chip selection signals, respectively; and a 3-states buffer configured to output the constant voltage from the second terminal to the single ready-busy line according to en the state signal outputted from the third terminal.

8. The memory system of claim 7,
wherein the 3-states buffer outputs the constant voltage to a fourth terminal when the output of the third terminal has a low logical value, and floats the fourth terminal when the output of the third terminal has a high logical value, and
wherein the fourth terminal is coupled to the single ready-busy line.

9. The memory system of claim 1, wherein the peripheral circuit receives a read enable signal and a write enable signal, outputs data to the external device during the enablement of the one of chip selection signals and the read enable signal, receives data from the external device during the enablement of the one of chip selection signals and the write enable signal, and disallows data-communication with the external device during the enablement of the one of chip selection signals and the disablement of both of the read enable signal and the write enable signal.

10. The memory system of claim 1, wherein the peripheral circuit receives an address latch enable signal and a command latch enable signal, receives an address from the external device during the enablement of the one of chip selection signals and the address latch enable signal, and receives a command from the external device during the enablement of the one of chip selection signals and the command latch enable signal.

11. The memory system of claim 10,
wherein the ready-busy signal generator receives an address latch enable signal and a command latch enable signal including control bits, and biases the single ready-busy line according to whether the peripheral circuit is in the ready or busy state when the one of chip selection signals is enabled and the control bits have a predetermined value.

12. The memory system of claim 10,
wherein the ready-busy signal generator comprises a state-request signal generation module configured to receive the address latch enable signal and the command latch enable signal, and generate a state-request signal according to the control bits,
wherein the ready-busy signal generator biases the single ready-busy line according to whether the peripheral circuit is in the ready or busy state during the enablement of the one of chip selection signals and the state-request signal.

13. A memory system comprising:
a plurality of semiconductor memory devices coupled to a single channel and a single ready-busy line; and
a controller coupled to the channel, and configured to select one among the semiconductor memory devices in response to enabled one of chip selection signals and configured to conununicate with the selected semiconductor memory device over the channel,
wherein the controller is further coupled to the plurality of the semiconductor memory devices through the single ready-busy line,
wherein the controller further determines whether the selected semiconductor memory device is in a ready or busy state by detecting a ready-busy signal provided from the selected semiconductor memory device through the single ready-busy line during enablement of the enabled chip selection signal, and
wherein each of the plurality of semiconductor memory devices does not generate the ready-busy signal when not corresponding to one of the chip selection signals.

14. The memory system of claim 13,
wherein the controller further instructs an operation for the selected semiconductor memory device through the channel when the selected semiconductor memory device is determined as in the ready state, and
wherein the operation includes one of a program operation, a read operation, and an erase operation.

15. The memory system of claim 13, wherein the controller further transmits a write enable signal and a read enable signal to the plurality of the semiconductor memory devices, outputs data through the channel to the selected semiconductor memory device during the enablement of one of the chip selection signals and the write enable signal, receives data through the channel from the selected semiconductor memory device during the enablement of one of the chip selection signals and the read enable signal, and disallows data-communication through the channel with the selected semiconductor memory device during the enablement of one of the chip selection signals and the disablement of both of the read enable signal and the write enable signal.

16. The memory system of claim 15, wherein the controller further detects the ready-busy signal from the single ready-busy line during the enablement of one of the chip selection signals and the disablement of both of the read enable signal and the write enable signal.

17. The memory system of claim 13, wherein the controller further transmits an address latch enable signal and a command latch enable signal to the plurality of the semiconductor memory devices, outputs an address through the channel to the selected semiconductor memory device during the enablement of one of the chip selection signals and the enablement of the address latch enable signal, and outputs a command through the channel to the selected semiconductor memory device during the enablement of one of the chip selection signals and the enablement of the command latch enable signal.

18. The memory system of claim 17,
wherein the plurality of the semiconductor memory devices is divided into memory groups, and the chip selection signals are transmitted to the memory groups respectively, and
wherein the controller further transmits the address latch enable signal and the command latch enable signal including control bits specifying a semiconductor memory device included in one of the memory groups selected by enabled one of the chip selection signals, and determines whether the semiconductor memory device specified by the control bits is in the ready or busy state, based on the ready-busy signal.

19. A memory system comprising:
a plurality of semiconductor memory devices coupled to a ready-busy line and a plurality of chip selection lines,
wherein each of the plurality of semiconductor memory devices comprises:
a memory cell array;
a peripheral circuit configured to control the memory cell array and operate in a first mode to communicate with an external device in response to a chip selection signal input through one of the plurality of chip selection lines or in a second mode not to communicate with the external device; and a ready-busy signal generator configured to bias the ready-busy line at a first level or a second level according to whether the peripheral circuit is in a ready or busy state when the chip selection signal is enabled, and configured not to bias the ready-busy line regardless of the peripheral circuit when the chip selection signal is disabled.

* * * * *